United States Patent
Shawver

[11] Patent Number: 5,996,956
[45] Date of Patent: Dec. 7, 1999

[54] MOUNTING PLATFORM FOR AN ELECTRONIC DEVICE

[76] Inventor: Michael Shawver, 7283 Wild Currant Way, Oakland, Calif. 94611-1340

[21] Appl. No.: 09/098,074

[22] Filed: Jun. 16, 1998

Related U.S. Application Data

[60] Provisional application No. 60/052,760, Jun. 17, 1997, and provisional application No. 60/063,885, Oct. 31, 1997.

[51] Int. Cl.$^6$ ..................................................... H05K 5/00
[52] U.S. Cl. ...................... 248/309.1; 248/688; 345/173; 345/179; 361/686; 364/708.1
[58] Field of Search .................................. 248/309.1, 688, 248/316.1, 316.5, 316.7; 345/173, 179, 901, 146; 361/686, 683; 364/708.1; 400/682, 685, 681

[56] References Cited

U.S. PATENT DOCUMENTS

| | | | |
|---|---|---|---|
| 4,940,204 | 7/1990 | Nelson et al. | 248/688 |
| 5,478,037 | 12/1995 | Haltof | 248/309.1 X |
| 5,480,115 | 1/1996 | Haltof | 248/309.1 X |
| 5,494,250 | 2/1996 | Chen | 248/316.7 |
| 5,751,546 | 5/1998 | Clark et al. | 361/686 |
| 5,822,546 | 10/1998 | George | 395/281 |
| 5,859,628 | 1/1999 | Ross et al. | 345/173 |

*Primary Examiner*—Ramon O. Ramirez
*Assistant Examiner*—Stephen S. Wentsler
*Attorney, Agent, or Firm*—Limbach & Limbach L.L.P.

[57] ABSTRACT

A mounting platform for holding and operating an electronic device having a plurality of activatable controls. The mounting platform includes a platform member having a front mounting surface, a plurality of tab members extending from the platform member to removably secure the electronic device to the front mounting surface, and a stylus assembly attached to the platform member. The stylus assembly includes a guide wall having a guide surface with a plurality of detente recesses formed thereon, a stylus member slidably mounted relative to the guide surface and having a stylus arm that opposes and is movable toward the front mounting surface, and a spring connected to the stylus member that includes a detente engagement tab which is slidable along the guide surface for selective engagement with the detente recesses. The stylus member is slidable for selectively engaging the detente engagement tab with the detente recesses to selectively position the stylus arm opposite predetermined positions of the front mounting surface. Those predetermined positions correspond to the locations of the activatable controls of the electronic device. For each of the predetermined positions, the stylus arm is movable to contact and activate the corresponding control of the electronic device.

20 Claims, 5 Drawing Sheets

MOUNTING PLATFORM FOR AN ELECTRONIC DEVICE

This application claims benefit of Provisional Appln. 60/052,760 filed Jun. 17, 1997 and 60/063,885 filed Oct. 31, 1997.

FIELD OF THE INVENTION

The present invention relates to mounting platforms, and more particularly to a mounting platform used to support and activate a hand held electronic device.

BACKGROUND OF THE INVENTION

Recently, various types of hand held electronic devices for personal data organization have been successfully marketed. One such type of device is a personal digital assistant (PDA) sold under the trademarks PalmPilot and Palm III, available from Palm Computing of Mountain View, Calif. This PDA 2 includes control buttons 3 and a touch sensitive screen 4 with touch sensitive screen activation areas 5 displayed thereon, as illustrated in FIG. 1. A separate hand-held stylus is typically included to activate the touch sensitive screen activation areas 5, which are on-screen controls that are bit mapped areas on a touch sensitive screen that when touched, they implement predetermined changes in computer activity. PDA's typically display phone numbers, to-do lists, calendars, digitally stored maps, directions, etc., which are accessible through touching the activation areas 5 and/or control buttons 3.

One problem with such hand-held devices is that it takes both hands to operate. One hand is used to hold the device, while the other hand manipulates the stylus and/or control buttons. Many times, both hands are not available to hold the PDA, pull out the hand-held stylus, and operate the screen activation areas.

Another problem with hand held PDA devices is that the size of the screen activation areas can be small and therefore difficult to operate with the stylus, especially if only one of the user's hands is available. For example, the display can show a personal phone list where the user needs to touch the stylus on the individual displayed names to retrieve information. However, when the displayed names are small, it can be difficult to touch the screen activation areas for the individual names using a hand-held stylus.

There is a need for a device to make operation of PDA's more convenient, especially with only a single hand. Further, there is a need for a more convenient method of precisely touching selected activation areas on a PDA touch sensitive screen.

SUMMARY OF THE INVENTION

The present invention solves the aforementioned problems by providing a mounting platform for holding a PDA device, and a movable stylus attached to the mounting platform for conveniently activating the PDA controls.

The present invention is a mounting platform, for an electronic device having a plurality of activatable controls, that includes a platform member having a front mounting surface, a plurality of tab members extending from the platform member disposed to removably secure an electronic device to the front mounting surface, and a stylus assembly attached to the platform member. The stylus assembly includes a guide wall having a guide surface, and a stylus element slidably mounted relative to the guide surface having an engagement portion that is slidable along the guide surface, and having a stylus arm that is movable toward the front mounting surface. The stylus element engagement portion is slidable along the guide surface for selectively positioning the stylus arm opposite predetermined positions of the front mounting surface.

In another aspect of the present invention, the mounting platform includes a platform member having a front mounting surface, a plurality of tab members extending from the platform member disposed to removably secure an electronic device to the front mounting surface, and a stylus assembly attached to the platform member. The stylus assembly includes a guide wall having a guide surface with a plurality of detente recesses formed thereon, and a stylus element slidably mounted relative to the guide surface, the stylus element having a detente engagement tab that is slidable along the guide surface for selective engagement with the detente recesses and a stylus arm that is movable toward the front mounting surface. The stylus element is slidable for selectively engaging the detente engagement tab with the detente recesses to selectively position the stylus arm opposite predetermined positions of the front mounting surface.

In yet another aspect of the present invention, the mounting platform includes a platform member having a front mounting surface, a plurality of tab members extending from the platform member disposed to removably secure an electronic device to the front mounting surface, and a stylus assembly attached to the platform member. The stylus assembly includes a guide wall having a guide surface with a plurality of detente recesses formed thereon, a stylus member slidably mounted relative to the guide surface and having a stylus arm that is movable toward the front mounting surface, and a spring connected to the stylus member and including a detente engagement tab that is slidable along the guide surface for selective engagement with the detente recesses. The stylus member is slidable for selectively engaging the detente engagement tab with the detente recesses to selectively position the stylus arm opposite predetermined positions of the front mounting surface.

Other objects and features of the present invention will become apparent by a review of the specification, claims and appended figures.

DETAILED DESCRIPTION OF THE PREFERRED EMBODIMENTS

The present invention is a mounting platform for receiving, holding and operating an electronic device having control buttons and/or touch sensitive screen activation areas (on-screen controls). The mounting platform attaches to mounting elements (not shown) to support the electronic device inside an automobile, on a desk top, etc., so the user can conveniently view and operate the electronic device.

Figure 1:
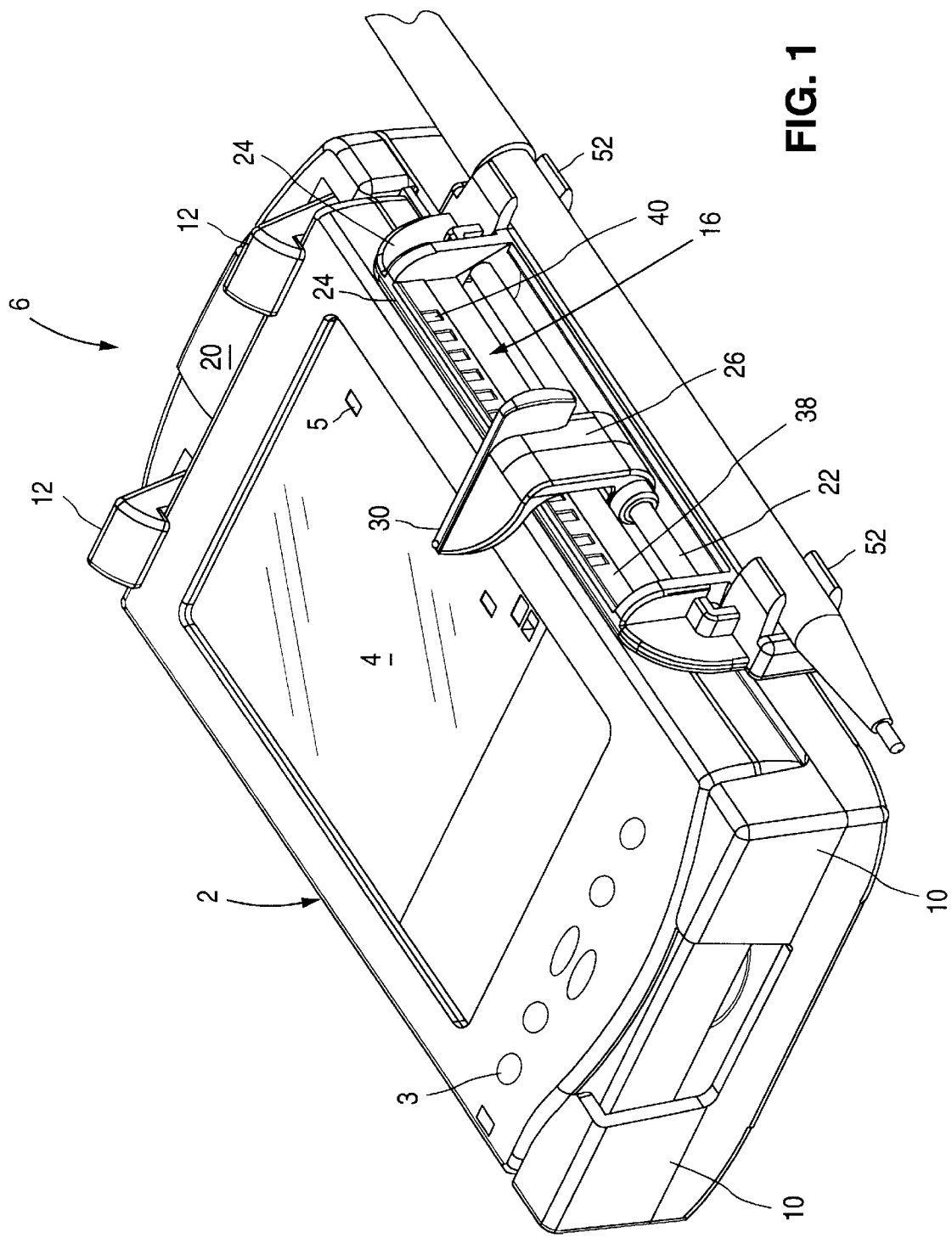
FIG. 1 is an elevated perspective view of a PDA mounted in the mounting platform of the present invention.

The present invention is best described with respect to a personal digital assistant (PDA) 2 having control buttons 3 and a touch sensitive screen 4 with displayed touch sensitive screen activation areas 5, as illustrated in FIG. 1. Touch sensitive screen activation areas 5 are on-screen controls that are bit mapped areas on a touch sensitive screen that when touched, they implement predetermined changes in computer activity. Such PDA's are sold under the trademarks PalmPilot and Palm III, available from Palm Computing of Mountain View, Calif. These devices include a separate hand-held stylus to operate screen activation areas 5. It should be noted, however, that the mounting platform of the present invention is ideal for any portable electronic device, such as a portable game console, etc., that has control buttons and/or a touch sensitive display screen.

Figure 2:
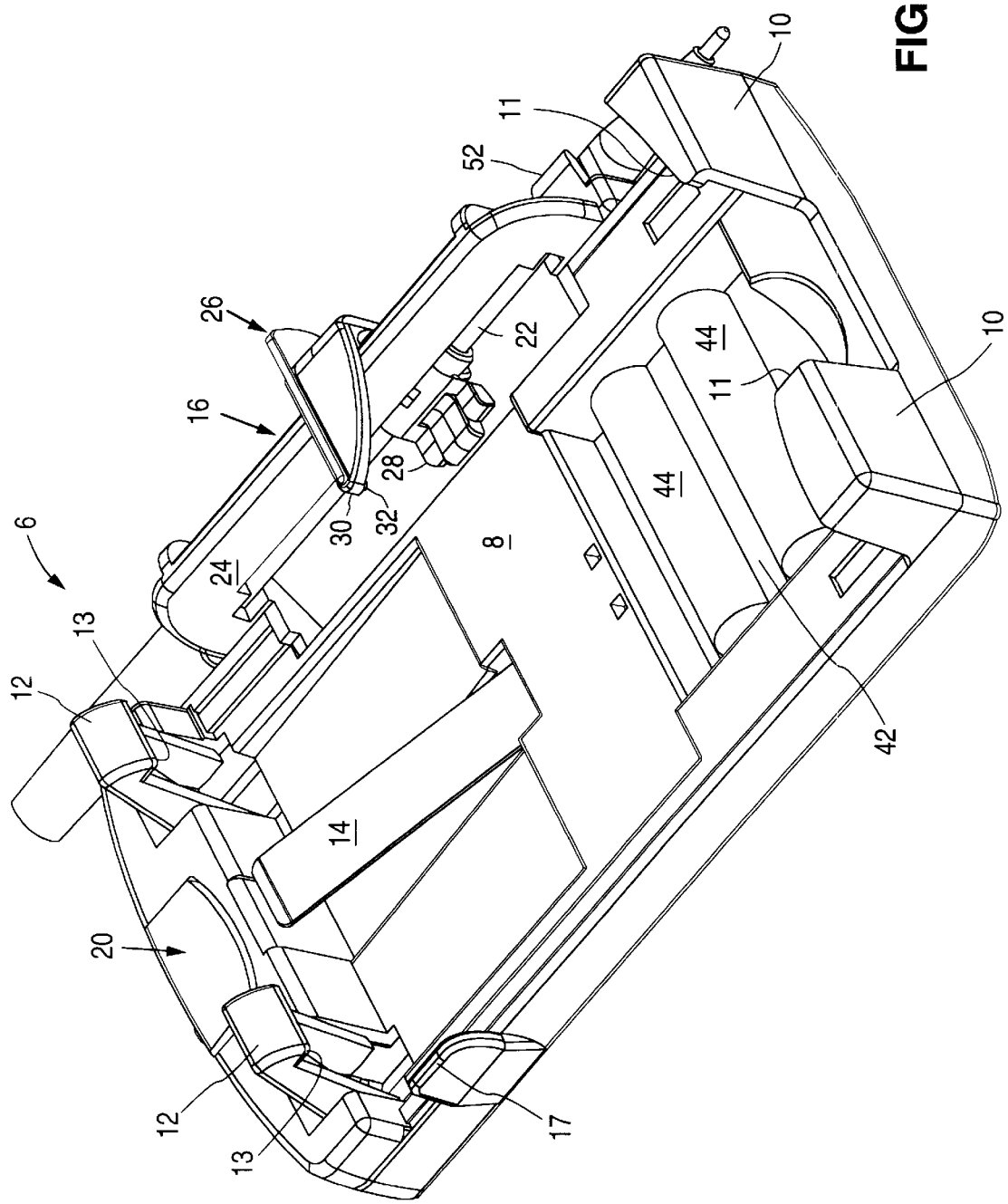
FIG. 2 is an elevated perspective view of the mounting platform of the present invention.

The mounting platform 6 of the present invention is best illustrated in FIGS. 1 and 2, and includes a front mounting surface 8, fixed tabs 10, movable tabs 12, a spring 14, and a stylus assembly 16.

Fixed tabs 10 extend from front surface 8 near a bottom end thereof and terminate with overhang portions 11. Movable tabs 12 extend from front surface 8 near a top end thereof (opposing fixed tabs 10) and terminate with overhang portions 13. The fixed and movable tabs 10/12 define a mounting space therebetween on front surface 8 for receiving and holding a PDA 2. Movable tabs 12 are spring loaded toward fixed tabs 10, and in the preferred embodiment are connected to an operating button 20 which moves movable tabs 12 into a retracted position away from fixed tabs 10 against the bias of an internal spring (not shown) for mounting and ejecting PDA 2 on/from surface 8.

Spring 14 extends from front surface 8 to engage with and to exert an upward force against a back panel of the PDA 2. This upward force ejects the PDA from surface 8 when movable tabs 12 are moved to their retracted position.

Figure 3:
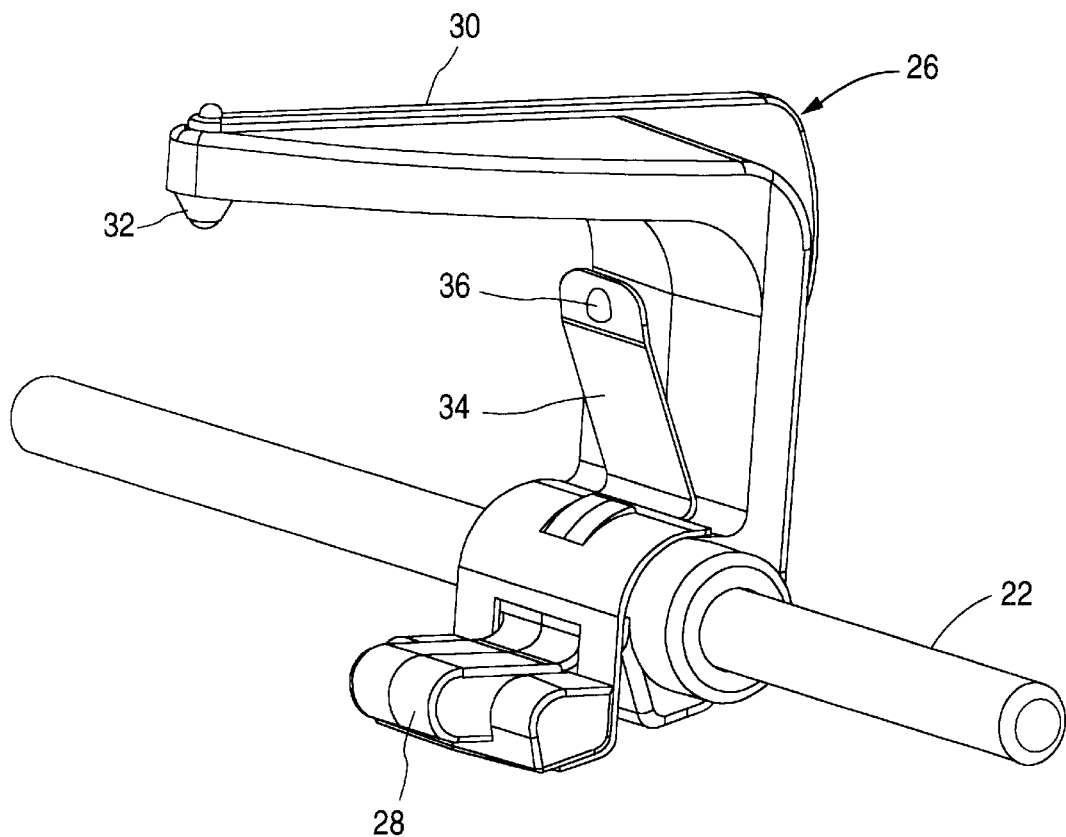
FIG. 3 is a perspective view of the stylus assembly of the present invention.
Figure 4:
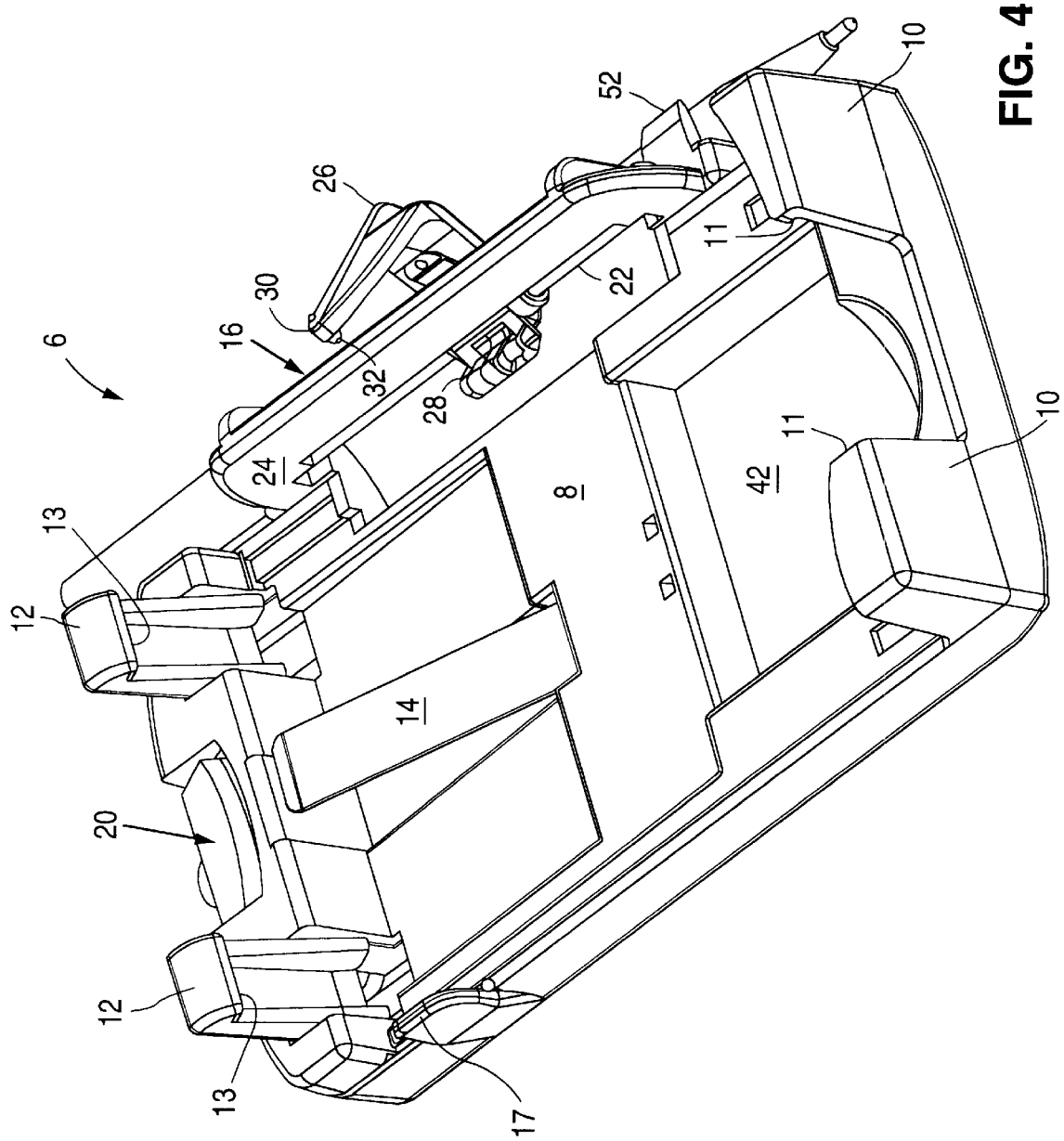
FIG. 4 is an elevated perspective view of the mounting platform of the present invention illustrating the stylus member and movable tabs in their retracted positions.

Stylus assembly 16 is mounted to the platform 6 and includes a slide rod 22, a guide wall 24 and a U-shaped stylus member 26, as best illustrated in FIGS. 1 and 3. The stylus member 26 has a positioning prong 28 and a stylus prong 30. The stylus prong 30 terminating with a stylus tip 32 for contacting and activating screen activation areas 5 of PDA 2. The stylus member 26 is slidably mounted to slide rod 22 in such a manner (and with such a weight distribution) that, when the mounting surface 8 faces generally upwards, the stylus prong 30 pivots away from mounting surface 8 and into an unmount position under the force of gravity, as shown in FIG. 4. This position facilitates the mounting of the PDA on surface 8 by pivoting the stylus prong 30 out of the way of a PDA being mounted to surface 8. A stylus spring 34 is attached to and extends away from a central portion of the stylus member 26. The stylus spring 34 has a detente engagement tab 36 near a terminal end thereof.

The guide wall 24 has a guide surface 38 with a plurality of detente recesses 40 formed thereon for engaging detente engagement tab 36 of spring 34. The detente recesses 40 are positioned to coincide with screen activation areas 5 on PDA screen 4 as further described below.

The PDA 2 is mounted to mounting platform 6 in the following manner. When the mounting platform 6 is oriented with surface 8 facing generally upward, the stylus member 26 pivots under gravity to the unmount position shown in FIG. 4. In this unmount position, stylus prong 30 is positioned to allow the PDA 2 to mount onto surface 8. The bottom end of PDA 2 is inserted against fixed tabs 10 and under overhang portions 11 thereof. Movable tabs 12 are deflected back so that the top end of PDA 2 can be placed down flat on surface 8 against the bias of spring 14. The backward deflection of moveable tabs 12 can be done by manually deflecting tabs 12 back, depressing button 20, or by pressing the PDA against tabs 12 which moves them away from the PDA. Once PDA 2 is in place against surface 8, movable tabs 12 are moved forward by the force of the internal spring (not shown) so that overhang portions 13 engage over the upper end of PDA 2. The PDA is now fixed and held in place against surface 8 by movable tabs 12, fixed tabs 10, stylus assembly 16 and a side tab 17 opposing the stylus assembly 16. To eject the PDA from mounting platform 6, movable tabs 12 are moved away from PDA 2 (either manually or by depressing button 20), where spring 14 ejects the PDA away from surface 8.

Stylus member 26 is used to activate screen activation areas 5 on screen 4. As the PDA is mounted to surface 8, the PDA pushes down on positioning prong 28 which pivots stylus prong 30 over the top of the PDA as it inserts onto surface 8, and against the bias of stylus spring 34 when detente engagement tab 36 engages guide surface 38, whereby stylus tip 32 is positioned directly over screen 4. The stylus member 26 is slidable along slide rod 22, where detente engagement tab 36 travels between an engages the various detente recesses 40. Detente recesses 40 are positioned to correspond to predetermined screen activation areas 5. When detente engagement tab 36 is engaged with a particular detente recess 40, stylus tip 32 is positioned directly over (opposite) a corresponding screen activation areas 5. Thereafter, the user can press down on stylus prong 30, which pivots stylus member 26 against the bias of stylus spring 34 until stylus tip 32 touches and activates the particular screen activation areas 5 on screen 4. The detente recesses 40 allow a user to conveniently position the stylus prong 30 and activate screen activation areas 5 therewith with a single hand. Upon the ejection of the PDA, stylus spring 34 aids in the pivoting of stylus member 26 to the unmount position.

Figure 5:
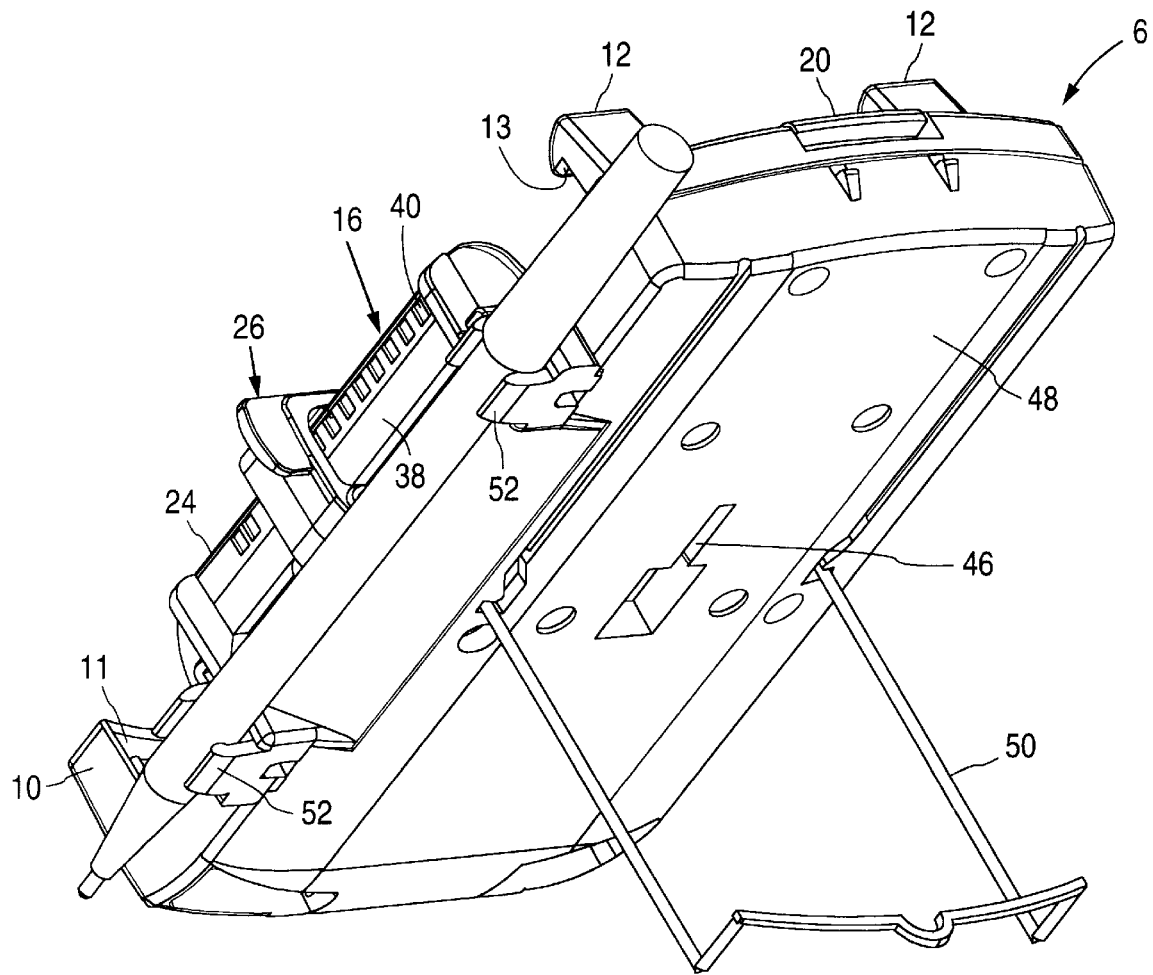
FIG. 5 is a perspective view of the rear side of the mounting platform of the present invention.

Other features of the mounting platform 6 include a compartment 42 formed in surface 8 for storage of items such as extra batteries 44 or note pads. An attachment slot 46 is formed on a back surface 48 of mounting platform 6, as illustrated in FIG. 5, to removably engage a mounting device for attaching mounting platform 6 to any automobile interior surface (such as a windshield, dashboard, or floor console), or any home or office surface (such as a wall or computer monitor). A flip down desk stand 50 is rotatably attached to back surface 48 for desk use. A pen holder 52 is formed on the stylus assembly to hold a pen and/or extra stylus.

Most components of the mounting platform are preferably made of injection molded plastic.

It is to be understood that the present invention is not limited to the sole embodiment described above and illustrated herein, but encompasses any and all variations falling within the scope of the appended claims. For example, the stylus prong 30 could be fixed directly over surface 8, in which case the PDA would slide into place between the stylus prong and the mounting surface 8. Further, the stylus tip 32 can be used to activate control buttons instead of or in addition to touch sensitive screen activation areas. Lastly, stylus assembly could provide movement of the stylus member along a guide surface without having detente recesses formed thereon for specific location placement.

What is claimed is:

1. A mounting platform for an electronic device having a plurality of activatable controls, comprising:

a platform member having a front mounting surface;

a plurality of tab members extending from the platform member disposed to removably secure the electronic device to the front mounting surface; and a stylus assembly attached to the platform member that includes:

a guide wall having a guide surface, and a stylus element slidably mounted relative to the guide surface having an engagement portion that is slidable along the guide surface, and having a stylus arm that is movable toward the front mounting surface;

wherein the stylus element engagement portion is slidable along the guide surface for selectively positioning the stylus arm opposite predetermined positions of the front mounting surface.

2. The mounting platform of claim 1, wherein the stylus element further comprises:

a spring connected to the stylus arm and including the engagement portion thereon, wherein the spring biases the engagement portion against the guide surface and the stylus arm is movable against the bias of the spring toward the front mounting surface.

3. The mounting platform of claim 1, wherein the stylus element further comprises:

a spring connected to the stylus arm and including the engagement portion thereon;

wherein the stylus arm is U-shaped and has a stylus prong and a positioning prong; and wherein the stylus arm is movable between an unmount position in which the stylus prong is moved away from the front mounting surface and the engagement portion is disengaged from the guide surface, a mount position in which the stylus prong is moved toward the front mounting surface and the engagement portion engages the guide surface, and a control activation position in which the stylus prong is moved against the bias of the spring to engage with one of the controls of the electronic device secured on the mounting platform.

4. A mounting platform for an electronic device having a plurality of activatable controls, comprising:

a platform member having a front mounting surface;

a plurality of tab members extending from the platform member disposed to removably secure the electronic device to the front mounting surface; and a stylus assembly attached to the platform member that includes:

a guide wall having a guide surface with a plurality of detente recesses formed thereon, and a stylus element slidably mounted relative to the guide surface having a detente engagement tab that is slidable along the guide surface for selective engagement with the detente recesses, and having a stylus arm that is movable toward the front mounting surface;

wherein the stylus element is slidable for selectively engaging the detente engagement tab with the detente recesses to selectively position the stylus arm opposite predetermined positions of the front mounting surface.

5. The mounting platform of claim 4, wherein when the electronic device is secured to the front mounting surface by the tab members, each of the predetermined positions corresponds to one of the plurality of controls on the electronic device, and wherein for each of the predetermined positions, the stylus arm is movable to contact and activate the corresponding control of the electronic device.

6. The mounting platform of claim 4, wherein at least one of the tab members is movable to allow insertion and removal of the electronic device from the front mounting surface.

7. The mounting platform of claim 6, wherein a spring loaded member is connected to the at least one movable tab member to move the at least one movable tab for insertion and removal of the electronic device.

8. The mounting platform of claim 7, further comprising:

a spring extending from the front mounting surface for exerting a force on the electronic device secured to the front mounting surface in a direction away from the front mounting surface.

9. The mounting platform of claim 4, wherein the stylus element further comprises:

a spring connected to the stylus arm and including the detente engagement tab thereon, wherein the spring biases the detente engagement tab against the guide surface and the stylus arm is movable against the bias of the spring toward the front mounting surface.

10. The mounting platform of claim 4, wherein the stylus element further comprises:

a spring connected to the stylus arm and including the detente engagement tab thereon;

wherein the stylus arm is U-shaped and has a stylus prong and a positioning prong; and wherein the stylus member is movable between an unmount position in which the stylus prong is moved away from the front mounting surface and the detente engagement tab is disengaged from the guide surface, a mount position in which the stylus prong is moved toward the front mounting surface and the detente engagement tab engages the guide surface, and a control activation position in which the stylus prong is moved against the bias of the spring to engage with one of the controls of the electronic device secured on the mounting platform.

11. The mounting platform of claim 10, wherein the positioning prong is disposed to engage an electronic device mounted on the front mounting surface to move the stylus member from the unmount position to the mount position.

12. The mounting platform of claim 10, further comprising:

a desk stand member attached to the platform member for positioning between a retracted position and an extended position to support the platform member in an inclined position.

13. A mounting platform for an electronic device having a plurality of activatable controls, comprising:

a platform member having a front mounting surface;

a plurality of tab members extending from the platform member disposed to removably secure the electronic device to the front mounting surface; and a stylus assembly attached to the platform member that includes:

a guide wall having a guide surface with a plurality of detente recesses formed thereon, a stylus member slidably mounted relative to the guide surface and having a stylus arm that is movable toward the front mounting surface, and a spring connected to the stylus member and including a detente engagement tab that is slidable along the guide surface for selective engagement with the detente recesses;

wherein the stylus member is slidable for selectively engaging the detente engagement tab with the detente recesses to selectively position the stylus arm opposite predetermined positions of the front mounting surface.

14. The mounting platform of claim 13, wherein when the electronic device is secured to the front mounting surface by the tab members, each of the predetermined positions corresponds to one of the plurality of controls on the electronic device, and wherein for each of the predetermined positions, the stylus arm is movable to contact and activate the corresponding control of the electronic device.

15. The mounting platform of claim 13, wherein at least one of the tab members is movable to allow insertion and removal of the electronic device from the front mounting surface.

16. The mounting platform of claim 15, wherein a spring loaded member is connected to the at least one movable tab member to move the at least one movable tab for insertion and removal of the electronic device.

17. The mounting platform of claim 13, wherein the spring biases the detente engagement tab against the guide surface and the stylus arm is movable against the bias of the spring toward the front mounting surface.

18. The mounting platform of claim 17, wherein the stylus member is movable between an unmount position in which the stylus arm is moved away from the front mounting surface and the detente engagement tab is disengaged from the guide surface, a mount position in which the stylus arm is moved toward the front mounting surface and the detente engagement tab engages the guide surface, and a control activation position in which the stylus arm is moved against the bias of the spring to engage with one of the controls of the electronic device secured to the front mounting surface.

19. The mounting platform of claim 18, wherein the stylus member includes a positioning member that engages the electronic device mounted on the front mounting surface to move the stylus member from the unmount position to the mount position.

20. The mounting platform of claim 18, further comprising:

a desk stand member rotatably attached to the platform member between a retracted position and an extended position for supporting the platform member in an inclined position.

* * * * *